United States Patent [19]

Douceur

[11] Patent Number: 5,764,526
[45] Date of Patent: Jun. 9, 1998

[54] DYNAMIC PROPAGATION DELAY CALCULATION USING AN ARRAY OF STORAGE CELLS

[75] Inventor: John R. Douceur, Bellevue, Wash.

[73] Assignee: Microsoft Corporation, Redmond, Wash.

[21] Appl. No.: 629,274

[22] Filed: Apr. 8, 1996

[51] Int. Cl.$^6$ .................................................. G06F 17/50
[52] U.S. Cl. .......................... 364/488; 364/489; 364/490; 395/500
[58] Field of Search .......................... 364/488–491, 364/578; 395/555, 200.17, 500

[56] References Cited

U.S. PATENT DOCUMENTS

| 5,535,145 | 7/1996 | Hathaway | 364/578 |
| 5,572,717 | 11/1996 | Pederson | 395/555 |
| 5,596,505 | 1/1997 | Steinweg et al. | 364/490 |
| 5,621,895 | 4/1997 | Weis et al. | 395/200.17 |

*Primary Examiner*—Emanuel Todd Voeltz
*Assistant Examiner*—Vuthe Siek
*Attorney, Agent, or Firm*—Lee & Hayes, PLLC

[57] ABSTRACT

Described herein is a computer-implemented method of dynamically determining propagation delays through a system of directedly interconnected components. An array of storage cells is maintained in a computer. The storage cells are logically referenced by row and column numbers. As components are added to the system, they are assigned enumerated component numbers. A particular storage cell corresponds to a potential network of directed paths between upstream and downstream components having component numbers equal to the row and column numbers of the particular storage cell, respectively. When the array is maintained in accordance with the invention, a cell contains the propagation delay from the corresponding upstream component to the corresponding downstream component if there is a path from the upstream component to the downstream component. Upon specifying a new component in the system, the array is increased in size by one row and one column. The invention includes writing the individual propagation delay of the new component to the storage cell having row and column numbers equal to the component number of the new component. Upon specifying a new connection from a component q to a component p, all storage cells are identified that correspond to a directed path network including a non-looping directed path completed by the new connection. The cells so identified are those that are both (a) in a column having a propagation delay entry in row p, and (b) in a row having a propagation delay entry in column q. Identified storage cells are updated with the propagation delay of the newly completed path, but only if the new value is greater than the prior entry and the path does not contain a loop.

25 Claims, 5 Drawing Sheets

|  | TO | | |
|---|---|---|---|
| | | 0 | 1 | 2 |
| FROM | 0 | $c_{0,0}$ | $c_{0,1}$ | $c_{0,2}$ |
| | 1 | $c_{1,0}$ | $c_{1,1}$ | $c_{1,2}$ |
| | 2 | $c_{2,0}$ | $c_{2,1}$ | $c_{2,2}$ |

|  | TO | | |
|---|---|---|---|
| | | 0 | 1 | 2 |
| FROM | 0 | $P_0$ | $P_0 + P_1$ | $P_0 + P_1 + P_2$ |
| | 1 | | $P_1$ | $P_1 + P_2$ |
| | 2 | | | $P_2$ |

NEW CONNECTION

| | | TO | | | | 90a |
|---|---|---|---|---|---|---|
| | | 0 | 1 | 2 | 3 | |
| FROM | 0 | $P_0$ | $P_0+P_1$ | $P_0+P_1+P_2$ | $P_0+P_3$ | |
| | 1 | NP | $P_1$ | $P_1+P_2$ | NP | |
| | 2 | NP | NP | $P_2$ | NP | |
| | 3 | NP | NP | NP | $P_3$ | |

Fig. 14

| | | TO | | | | 90b |
|---|---|---|---|---|---|---|
| | | 0 | 1 | 2 | 3 | |
| FROM | 0 | $P_0$ | $P_0+P_1$ | $P_0+P_1+P_2$ | $P_0+P_3$ | |
| | 1 | NP | $P_1$ | $P_1+P_2$ | NP | |
| | 2 | NP | NP | $P_2$ | NP | |
| | 3 | ~~NP~~ | ~~NP~~ | ~~NP~~ | $P_3$ | |

DYNAMIC PROPAGATION DELAY CALCULATION USING AN ARRAY OF STORAGE CELLS

TECHNICAL FIELD

This invention relates to systems of interconnected data or signal processing components and to methods for calculating propagation delays in such systems.

BACKGROUND OF THE INVENTION

There are many different types of systems in which signals or data are passed in a directed flow from source components (where the signals or data originate or enter the system), through transfer components (which may modify the signals or data), to sink components (where the signals or data terminate or exit the system). A multimedia computer is an example of such a system. In a multimedia computer, audio and video data might originate from a mass storage system, pass through decompression components, and be supplied to a speaker and a display device.

The invention described below will be used in a system for assembling software components or program modules that pass sampled audio and/or video data in a directed flow. The software components include source, transfer, and sink components. Each software component might be associated with one or more hardware devices and associated device driver programs. The invention could also be used in other contexts, such as in a computer program for simulating or modeling an interconnected system of source, transfer, and sink components.

Figures 1, 2, 3:
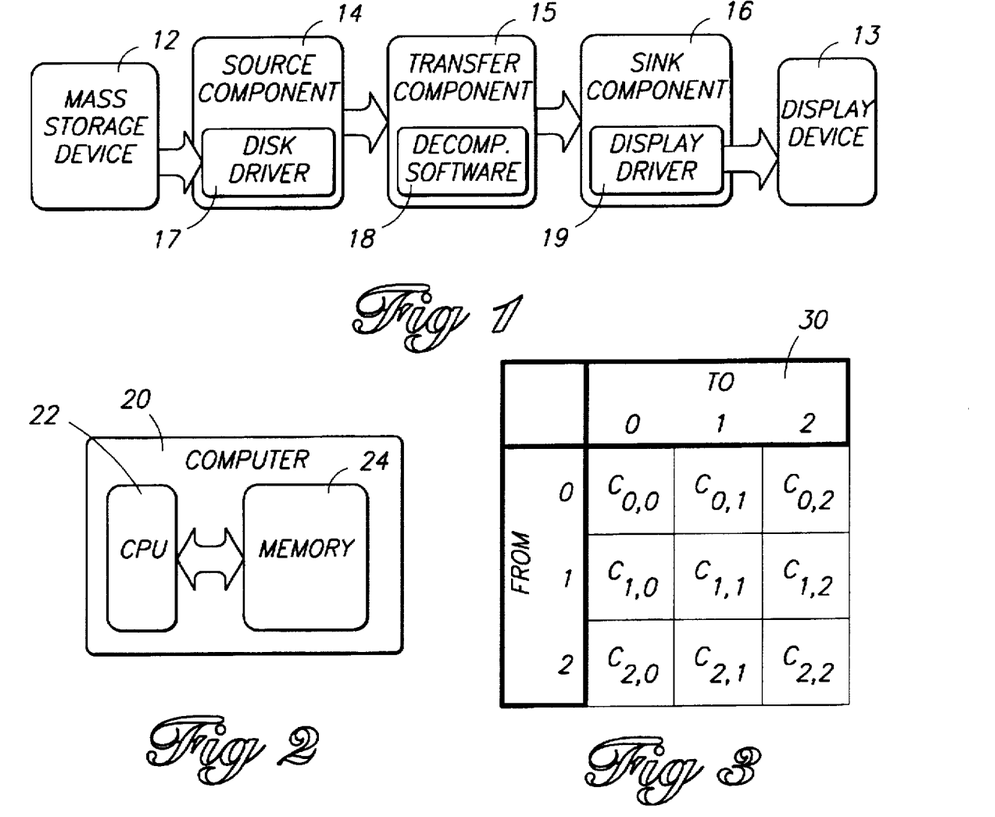
FIG. 1 is a block diagram showing a system of interconnected components for processing a signal or data stream.
FIG. 2 is a block diagram showing pertinent components of a computer system in accordance with the invention.
FIG. 3 is a diagrammatic view of a memory array such as is used in the preferred embodiment of the invention for maintaining propagation delay values.

FIG. 1 shows an example of an interconnected system of software components such as might be assembled in the context of this invention. Functionally, the system retrieves a compressed stream of sampled data representing a video segment from a mass storage device 12, decompresses the data, and displays it on a display device 13. In addition to the two physical devices (mass storage device 12 and display device 13), the system includes a source component 14, a transfer component 15, and a sink component 16. Source component 14 is associated with a device driver 17, in this case a hard disk driver, that handles details of communications with mass storage device 12. Source component 14 retrieves data from hard disk 12 at appropriate intervals and prepares or formats the data for subsequent handling by transfer component 15. Transfer component 15 is associated with decompression software 18 for decompressing data into a format suitable for handling by video display hardware. The decompressed data is received by sink component 16, which is associated with a video display driver 19 for transferring the decompressed data to a video display card and associated display device 13.

In systems involving video and audio data, it is often required to synchronize the rendering of a data stream either to an external clock or to another data stream. In such cases, it is essential that the propagation delay through a system of components be known.

Each component in the system has an associated propagation delay—the delay between receiving data on an "input" of the component and transmitting corresponding data on an "output" of the component. Source components, which have no inputs in the system, may still have an associated propagation delay, representing the time they take to provide a datum. For example, in the system of FIG. 1 the propagation delay of source component 14 includes the physical latency of retrieving data from hard disk 12, the interrupt response time and other delays associated with device driver 17, and the processing time required to prepare the data for delivery to the transfer component 15.

Similarly, sink components, which have no outputs in the system, may also have an associated propagation delay, representing the time they take to absorb a datum. For example, in the system of FIG. 1 the propagation delay of sink component 16 includes the processing time required to interpret data from transfer component 15, the interrupt response time and other delays associated with video display driver 19, and the physical latency of displaying the data on display device 13.

Propagation delays are additive—if an output of one component is connected to the input of a second component, the propagation delay from the input of the first component to the output of the second component is equal to the sum of the propagation delays of the two components. The overall system has a propagation delay equal to the maximum propagation delay from any source component in the system to any sink component in the system.

In the system of FIG. 1, the propagation delay of the overall system is not difficult to determine. It is equal to the sum of the propagation delay of all three system components: source component 14, transfer component 15, and sink component 16. In more complex systems, however, such as those involving multiple source components and sink components, the overall propagation delay might be more difficult to determine. When data-flow loops are involved, calculating the overall propagation delay is even more difficult.

The component assembly system in which the invention is likely to be used allows a designer (or application program) to specify individual components, along with their individual propagation delays, and one or more directed connections between those components. The components and directed connections are specified one at a time, in a sequence which is arbitrary but for the requirement that the specification of a component must precede the specification of a connection to or from that component. Alternatively, a set of components and connections may be specified as a group, in which case they are viewed as having been specified in an arbitrary sequence which satisfies the component-connection precedence constraint. A connection is said to be directed from one component to another when an output of the former component is connected to an input of the latter component. A directed path from one component to another is recursively defined to exist when there is either a directed connection from the former component to the latter component, or when there is a directed path from the former component to a component which has a directed connection to the latter component. When one component has a directed path to another component, the former component is known as an upstream component, and the latter component is known as a downstream component. In the example of FIG. 1, there are directed paths from source component 14 to transfer component 15, from source component 14 to sink component 16, and from transfer component 15 to sink component 16; however, there are only directed connections from source component 14 to transfer component 15, and from transfer component 15 to sink component 16.

Each path has an associated propagation delay, which is the sum of the propagation delays of the upstream and downstream components at each end of the path, plus the propagation delays of the intervening transfer components, if there are any.

The aggregation of all existing paths from an upstream component to a downstream component is referred to as a network of directed paths from the upstream component to the downstream component, or more simply, a directed path network from the upstream component to the downstream component. Where a directed path network includes multiple directed paths, the propagation delay from the upstream component to the downstream component is equal to the maximum propagation delay of all of the paths from the upstream component to the downstream component.

Loops, in which a component has a directed path to itself, are ignored for purposes of calculating propagation delay. The applicability of the present invention is limited to systems which contain either no loops or simple (first-order) loops, in which there is at most one directed path from any component to itself. Systems which contain compound loops (loops of second and higher order), in which there are multiple paths from a component to itself, are not amenable to the techniques employed by the present invention.

The motivation for this invention is the need to determine the propagation delay of such a system as it is assembled by a software system—rather than after its assembly is complete. In the past, it has been assumed that procedures for dynamically determining the propagation delay in such a system would be cumbersome and slow.

There are significant benefits to making propagation delay determinations during system assembly. For example, it allows the overhead of the calculations to be distributed over the assembly time rather than lumped into a single, large computation delay following assembly. In addition, intermediate propagation delay information calculated during component assembly might be useful to the person or application program assembling the components.

SUMMARY OF THE INVENTION

The invention is a system and method for dynamically determining overall propagation delay of an inter-connected component system, in which the propagation delay is updated after the specification of each new directed connection between components. The invention may also be used for dynamically determining the propagation delay between any two components in the system.

Propagation delays between components are stored in a matrix of propagation delay cells. Each cell is referenced by a row number and a column number, corresponding to the upstream and downstream components of a potential directed path network. When the matrix is completed, each cell contains either a value representing the propagation delay from the upstream component to the downstream component or a value indicating that there is no directed path network from the upstream component to the downstream component.

When a new component is specified, it is assigned an enumerated component number. A corresponding new row and a corresponding new column are added to the matrix. The cell having row and column numbers equal to the component number is updated to contain the individual propagation delay of the newly-added component. The other new matrix cells are initialized to values indicating that there is no directed path or directed path network from the new component to or from any other component.

When a new connection is specified, certain cells are identified for updating. These cells consist of any cells corresponding to directed path networks that include non-looping directed paths completed by the newly specified connection.

These cells are identified with reference to the matrix. For example, if the new connection is from component q to component p, any single cell that is both (a) in a column having an existing propagation delay entry in row p and (b) in a row having a propagation delay entry in column q is identified for updating. Once a cell is identified, it is updated with the propagation delay of the directed path network that includes the non-looping directed path completed by the newly specified connection. Assuming that the identified cell has row number x and column number y, the propagation delay is calculated as the sum of (a) the propagation delay entry in the cell having row number x and column number q and (b) the propagation delay entry in the cell having row number p and column number y. The cell is updated with the newly-calculated propagation delay unless the cell already contains a propagation delay entry. If the cell already contains a propagation delay entry, the cell is updated only if the newly-calculated value is greater than the existing value in the cell and if a loop is not being created.

BRIEF DESCRIPTION OF THE DRAWINGS

FIG. 10 is a flow chart showing preferred steps performed when adding a component. FIG. 10 also illustrates how the memory array of FIG. 8 is updated in response to the specification of the new component of FIG. 9.

FIG. 12 is a flow chart showing preferred steps performed when adding a new connection. FIG. 12 also illustrates how memory array 60 of FIGS. 8 and 10 is updated in response to the specification of the new connection of FIG. 11.

DETAILED DESCRIPTION OF THE PREFERRED EMBODIMENT

FIG. 2 shows a computer system 20 for dynamically calculating and maintaining propagation delay values through a system of directedly interconnected components of the type described above. The computer system includes a data processor or CPU 22 and computer memory 24. The data processor can be any one of a great number of data processors or microprocessors, such as those of the type commonly used in personal or desktop computers. Memory 24 can similarly take a number of forms, such as readable and writeable (read/write) electronic memory or more persistent mass storage memory. Data processor 22 is connected to write to and read from selectable cells or registers of memory 24. In the preferred embodiment disclosed herein, memory 24 has a plurality of randomly and individually addressable storage cells or registers.

A two-dimensional array or matrix of memory storage cells is allocated and used to represent all possible directed paths networks within a particular system of interconnected components, wherein each directed path network can include one or more directed paths. Such a memory array is shown symbolically in FIG. 3, generally designated by the reference numeral 30. The array has an equal number of rows and columns, corresponding to the number of components in the interconnected system. Each cell within the array is logically referenced by a row number and a column number. The row and column numbers are shown in FIG. 3. The row numbers range from 0 to 2, and the column numbers also range from 0 to 2.

The array of FIG. 3 has nine storage cells. In this discussion a particular storage cell will be referenced by the capital letter C followed by two subscripts. The first subscript identifies the cell by its row number, while the second subscript identifies the cell by its column number. For example, cell $C_{1,0}$ indicates the cell at row 1, column 0. All of the nine storage cells are labeled in this manner in FIG. 3.

Array 30 is used to store the values of propagation delays between components. To index the array, each component is given a unique component number corresponding to a row number and a column number. Each storage cell corresponds to the potential directed path network between upstream and downstream components having component numbers equal to the row and column numbers of the storage cell, respectively. Thus, cell $C_{a,b}$ corresponds to the directed path network from component a to component b. Cell $C_{b,a}$ corresponds to the directed path network from component b to component a. When the array is maintained as described below, each cell will contain the propagation delay of the corresponding directed path network.

Figure 4:
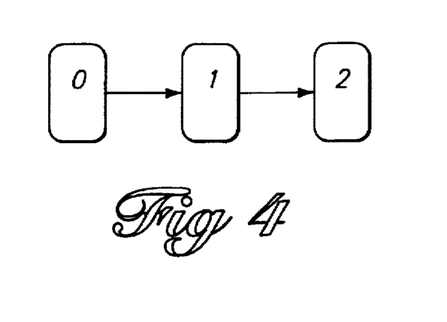
FIG. 4 shows an example of three interconnected components for processing a signal or data stream.

FIG. 4 shows an example system containing three components identified as components 0, 1, and 2. Component 0 has an output which is connected to an input of component 1. Component 1 has an output which is connected to an input of component 2. This system has two connections. The propagation delay from component 0 to component 1 is contained in cell $C_{0,1}$ of array 30, and is equal to the propagation delay of the directed path network from component 0 to component 1. The propagation delay from component 1 to component 2 is contained in cell $C_{1,2}$ of array 30, and is equal to the propagation delay of the directed path network from component 1 to component 2. The propagation delay from component 0 to component 2 is contained in cell $C_{0,2}$ of array 30, and is equal to the propagation delay of the directed path network from component 0 to component 2, which traces the single directed path from component 0, through component 1, to component 2.

The methodological steps described below result in an array such as array 30 in FIG. 3, wherein each cell corresponding to an ordered pair of components contains a propagation delay entry indicating the propagation delay from the row-associated component to the column-associated component. For example, the propagation delay from component 1 to component 2 in FIG. 4 is equal to the summed individual propagation delays of components 1 and 2. The propagation delay from component 0 to component 2 in FIG. 4 is equal to the summed individual propagation delays of components 0, 1, and 2.

Figure 5:
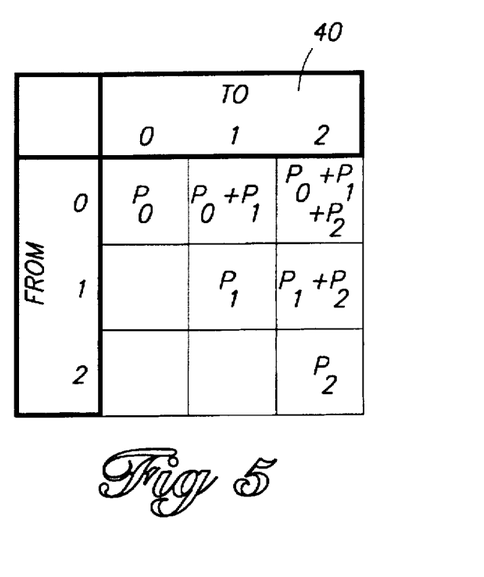
FIG. 5 is a memory array having propagation delays corresponding to the interconnected components of FIG. 4.

FIG. 5 shows an array 40 after its cells have been updated to reflect the propagation delays for the components and connections shown in FIG. 4. The variable $P_c$ indicates the individual propagation delay of component c. Thus, cell $C_{0,0}$, corresponding to the propagation delay of the single component 0, contains ii the individual propagation delay $P_0$ of component 0. Similarly, cells $C_{1,1}$ and $C_{2,2}$ contain $P_1$ and $P_2$, respectively. Cell $C_{0,1}$, corresponding to the propagation delay between components 0 and 1, contains the sum of the propagation delays of those components, $P_0+P_1$. Cell $C_{0,2}$, corresponding to the propagation delay between components 0 and 2, contains the sum of the propagation delays of the components along the maximal path from component 0 to component 2, $P_0+P_1+P_2$. Cell $C_{1,2}$, corresponding to the propagation delay between components 1 and 2, contains the sum of the propagation delays of those components, $P_1+P_2$. The remaining cells are left blank, or with an initialized value such as negative value, indicating the absence of a directed path or directed path network between the components.

Figure 6:
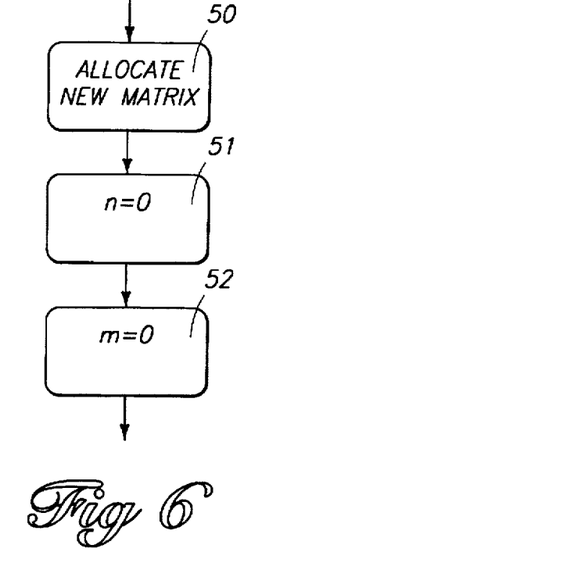
FIG. 6 is a flow chart showing initialization steps in accordance with the preferred embodiment of the invention.

FIG. 6 shows preferred initialization steps in accordance with the invention. These steps are performed by computer 20 before any components are specified. First step 50 comprises allocating a matrix of storage cells C for storing the propagation delay entries described above. The matrix initially has 0 rows and 0 columns. A variable n is initialized to 0 in step 51, indicating the number of components specified in the system. As new components are specified, n is incremented and the size of the matrix is increased. A variable m is initialized in step 52, indicating the maximum propagation delay in the system. As new components and connections are specified, m is updated to reflect the current maximum propagation delay.

Figure 7:
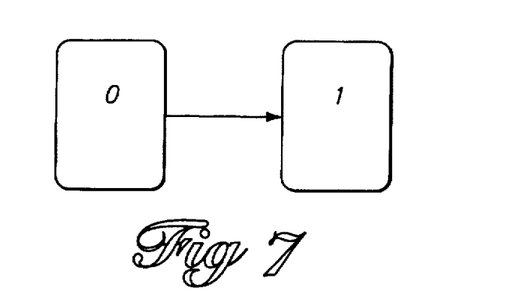
FIG. 7 is an example of two interconnected components.
Figure 8:
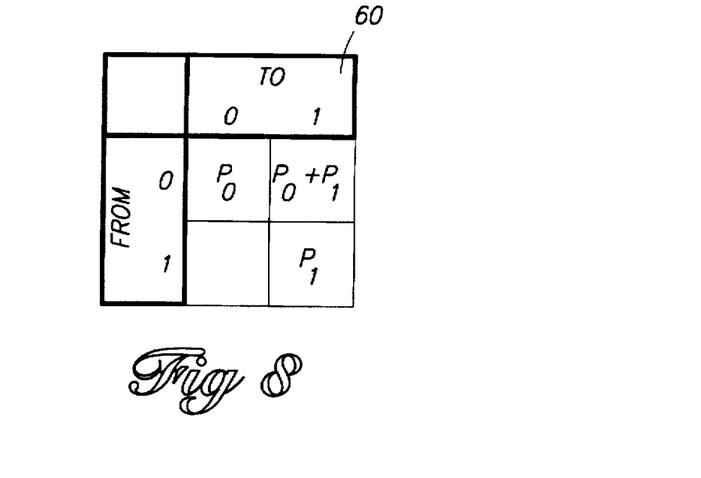
FIG. 8 is a memory array having propagation delays corresponding to the interconnected components of FIG. 7.

Further steps, to be described below, are performed upon the specification of new components and upon the specification of new connections between those components. To set up the following discussion, FIGS. 7 and 8 illustrate the results of these steps after two components have been specified and after a single connection has been specified. FIG. 7 shows the two components 0 and 1, and the connection from component 0 to component 1. FIG. 8 shows the corresponding filled-in matrix, designated by reference numeral 60. Matrix 60 contains the individual propagation delays of components 0 and 1 (P0 and P1), as well as the propagation delay from component 0 to component 1 (P0+P1). Note that the matrix is always increased in size so that it has an equal number of rows and columns, corresponding to the number of components specified in the system. The variable n is maintained to reflect the number of specified components.

Figure 9:
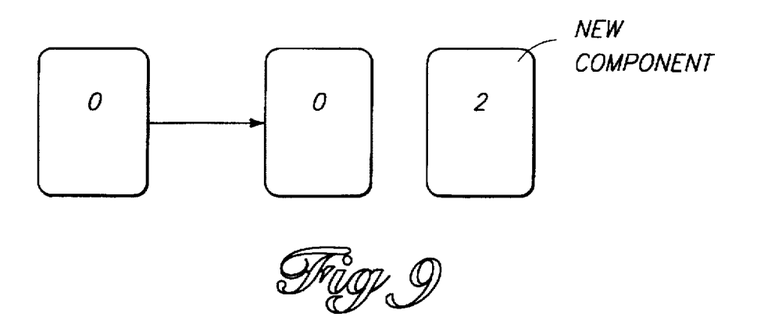
FIG. 9 shows the system of FIG. 7 with the addition of a third component.

The detailed steps of the invention are described now with reference to the component system of FIG. 9. FIG. 9 shows a system like that of FIG. 7, except that a new component 2 has been specified. At this point, no connections to or from component 2 have been specified. Matrix 60 will be updated to reflect the presence of the new component.

Figure 10:
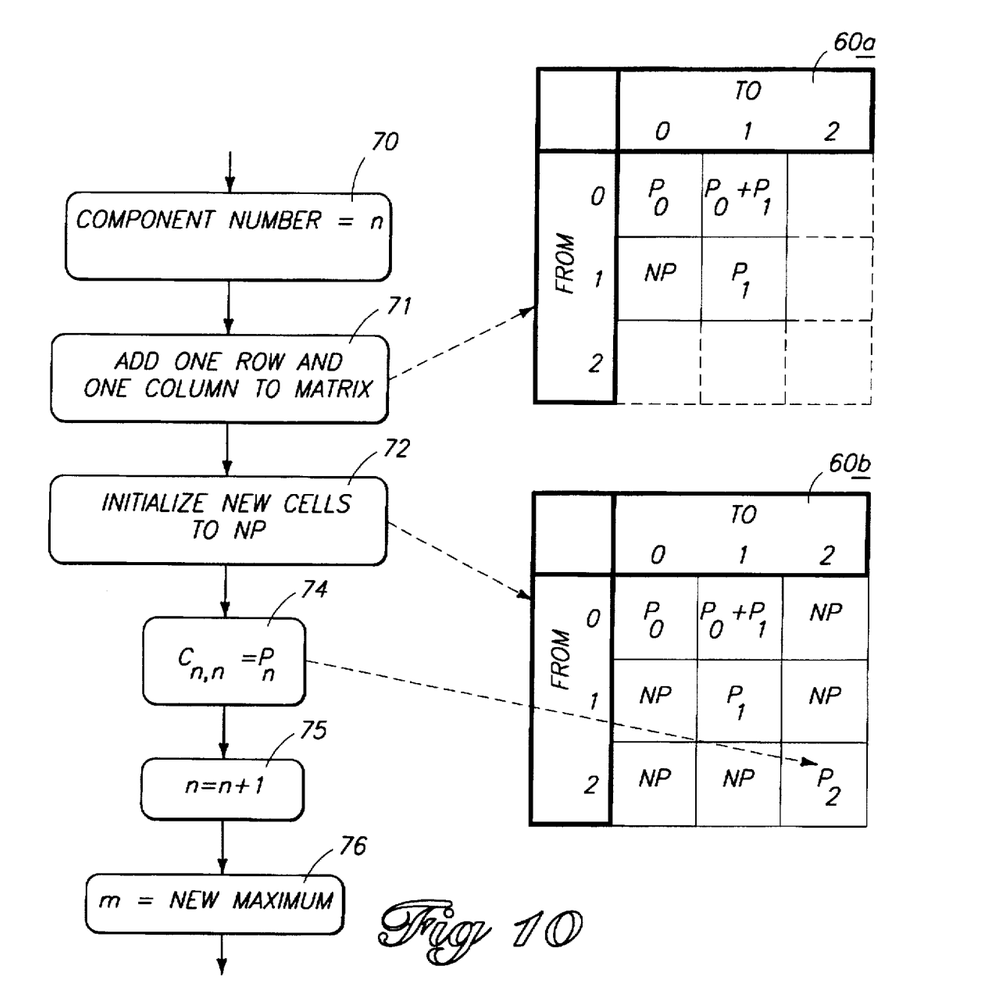

FIG. 10 shows the steps performed when a new component is specified, as well as illustrating the effect of the steps on matrix 60. Step 70 comprises enumerating a component number for the new component added to the system. In this case, components 0 and 1 have already been allocated, so variable n is equal to 2. Thus, the new component number is given a component number of 2.

Step 71 comprises increasing the size of matrix 60 by one row and one column. Illustrated matrix 60a shows the results of this step, with a new row 2 and a new column 2 shown in dashed lines. After step 71, the matrix has a number of rows and columns equal to the number of specified components.

Step 72 comprises initializing the newly allocated storage cells to values indicating the absence of a directed path or directed path network between the corresponding components. This is illustrated in matrix 60b by the designation NP, meaning "no path." In practice, a negative value such as −1 might be used to represent the absence of any directed path between components.

Step 74, also performed upon specifying a new component, comprises writing the individual propagation delay of the new component to the storage cell having row and column numbers equal to the component number of the new component—to the cell corresponding to the directed network path from the new component to itself—from the new component's input to its output. The results of this step are shown in matrix 60b of FIG. 10, with P2 being written to cell $C_{2,2}$. This step can be alternatively presented as an equation: $C_{n,n}=P_n$, wherein n is the component number of the new component.

Step 75 comprises incrementing variable n by 1 for further use as other new components are specified.

Once these steps are completed a step 76 is performed of setting the variable m equal to the new maximum of the propagation delay entries in the array or matrix of storage cells. This value represents the overall propagation delay of the system as it is assembled so far, and it is determined by taking the maximum of (a) the previous value of the variable m and (b) the propagation delay of the newly specified component.

Figure 11:
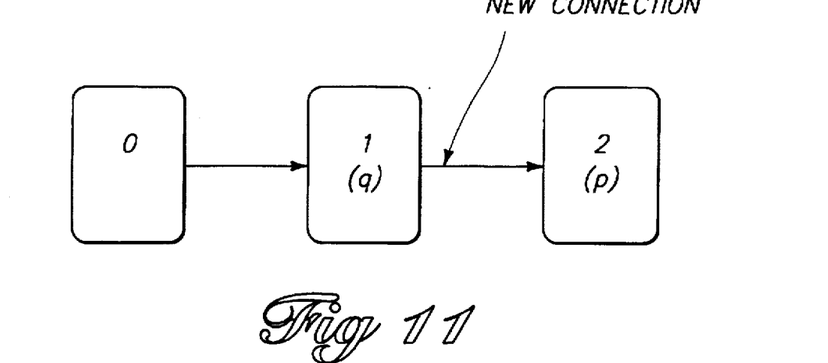
FIG. 11 shows the system of FIG. 9, with the addition of a new connection.
Figure 12:
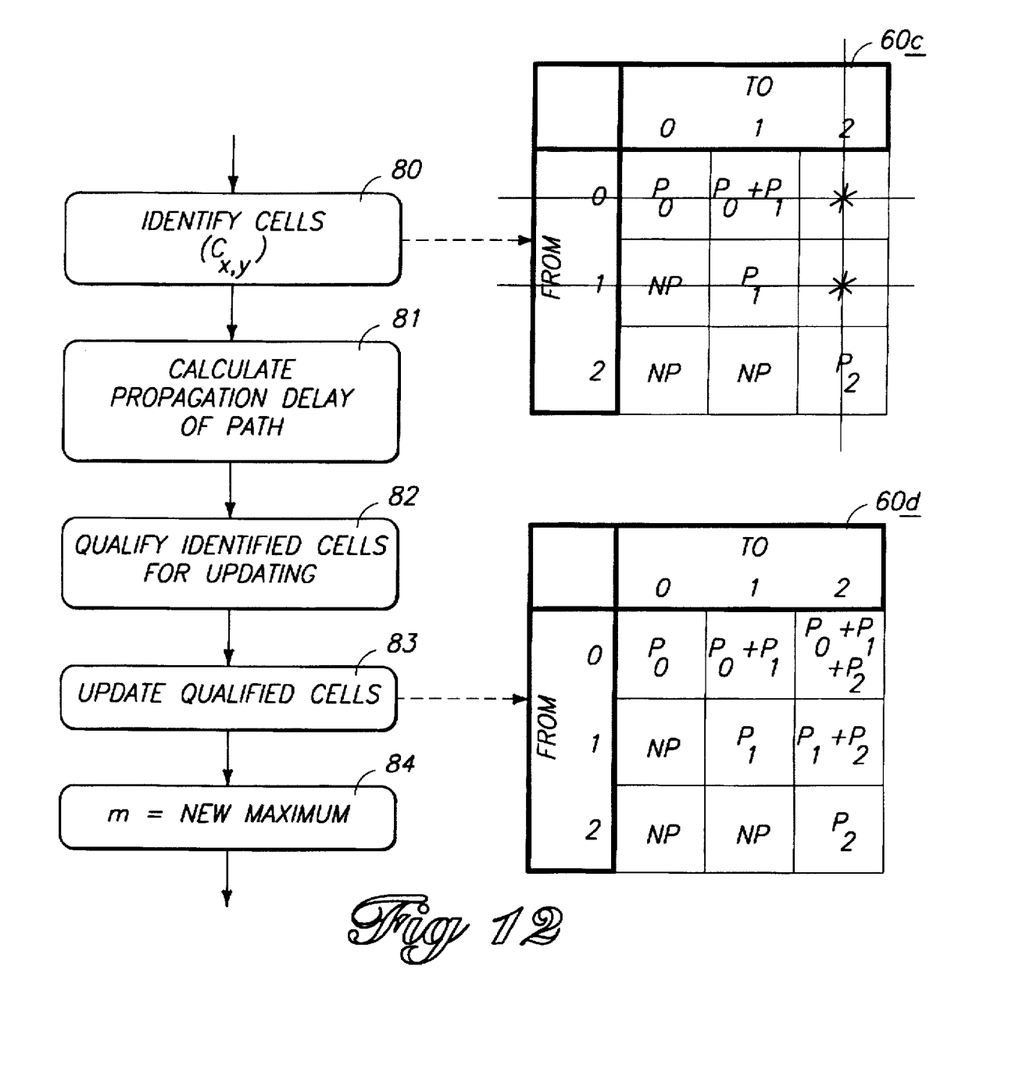

In FIG. 11, a new connection is specified from component 1 to component 2. In more general terms, a new connection will be referred to as a connection from a component q to a component p. FIG. 12 shows the preferred steps for updating matrix 60 upon the specification of such a new connection.

A step 80 comprises identifying certain storage cells of the matrix for updating. A cell is identified for updating if it corresponds to a directed path network that includes a non-looping directed path completed by the newly specified connection.

In the preferred embodiment of the invention, a particular cell, representing the directed network path from an upstream component x to a downstream component y, is identified for updating if both of the following two conditions are satisfied: (a) the storage cell corresponding to the directed network path from the upstream component x to component q contains a propagation delay entry; and (b) the storage cell corresponding to the directed network path from component p to the downstream component y contains a propagation delay entry. More concisely, step 80 comprises identifying any storage cell that is both (a) in a row having a propagation delay entry in column q and (b) in a column having a propagation delay entry in row p.

The results of this step in the illustrated example are shown in matrix 60c of FIG. 12, in which a line is drawn through each column having a propagation delay entry in row p and through each row having a propagation delay entry in column q. In the example, q is equal to 1 and p is equal to 2. Only column 2 has a propagation delay entry in row 2, and only rows 0 and 1 have propagation delay entries in column 1. Lines are therefore drawn through column 2 and through rows 0 and 1. Only those cells where the lines intersect meet both of the stated conditions. These identified cells $C_{0,2}$ and $C_{1,2}$—are marked with asterisks in matrix 60c.

A subsequent step 81 is performed for each storage cell and corresponding directed path network identified in step 80. Step 81 comprises calculating, for each identified storage cell, the propagation delay from the upstream component to the downstream component of the corresponding directed path network. More specifically, this step comprises calculating the propagation delay from the upstream component to the downstream component of the non-looping directed path completed by the newly specified connection. As explained above, this delay includes the individual propagation delays of the upstream and downstream components, as well as of any intervening components in the directed path from the upstream component to the downstream component.

To calculate the propagation delay of a path from upstream component x to downstream components passing through components q and p, a step is performed of reading a first propagation delay from cell $C_{x,q}$, the storage cell corresponding to the directed path network from the upstream component x of the path to the upstream component q of the newly specified connection. Another step is performed of reading a second propagation delay from cell $C_{p,y}$, the storage cell corresponding to the propagation delay from the downstream component p of the newly specified connection to the downstream component y of the path. The calculation of the propagation delay further comprises summing the first and second propagation delays that have been read from the matrix. This can be stated more concisely by the equation $P_{x,y}=P_{x,q}+P_{p,y}$, where $P_{x,q}$ and $P_{p,y}$ are values that are read from the existing matrix, from cells $C_{x,q}$ and $C_{p,y}$, respectively.

The calculating step further comprises taking the maximum of the calculated propagation delay and any previous calculated propagation delay written to the identified storage cell. In practice, this is implemented by a qualifying step 82 which is performed to determine if the propagation delay of each path qualifies as an updated value for the identified storage cell. In accordance with step 82, an identified cell $C_{x,y}$ is updated if and only if one or the other of the following two conditions are met:

(a) the identified cell $C_{x,y}$ does not already have a propagation delay entry; or (b) the identified cell $C_{x,y}$ contains a propagation delay entry that is less in value than the propagation delay of the path and the storage cell having row number p and column number q (cell $C_{p,q}$) does not contain a propagation delay entry.

The qualification procedure discriminates among four cases. In the first case, no path existed from the upstream component to the downstream component prior to the specification of the new connection, so the propagation delay from the upstream component to the downstream component is thus equal to the propagation delay of the newly completed path between these two components, and the cell should thus be updated. In the other three cases, one or more paths existed in the path network from the upstream component to the downstream component prior to the specification of the new connection. In the second case, the propagation delay of the newly completed path is not greater than the prior propagation delay between the components, so the value of the propagation delay between the components is not affected, and the cell should thus not be updated. In the third case, a loop is detected in the newly completed path, so the value of the propagation delay between the components is not affected, and the cell should thus should not be updated. In the fourth case, the newly completed path does not contain a loop and its propagation delay is greater than the prior propagation delay between the components, and the cell should thus be updated. Condition (a) above holds in and only in the first case, and condition (b) above holds in and only in the fourth case. Since these are the two cases for which the cell should be updated, the qualification procedure makes the correct determination of whether to update each cell.

Step 83 comprises updating any qualified cells with the values calculated in step 82. Alternatively stated, step 83 comprises writing the calculated propagation delays to the identified and qualified storage cells. Illustrated matrix 60d shows the result of this step. In the example, neither of the identified cells ($C_{0,2}$ and $C_{1,2}$) previously contained propagation delay entries. Accordingly, both cells are updated with the calculations of step 81. Cell $C_{0,2}$ is updated with the sum of the entries in cells $C_{0,1}$ and $C_{2,2}$: $(P_0+P_1)+P_2$. Cell $C_{1,2}$ is updated with the sum of the entries in cells $C_{1,1}$ and $C_{2,2}$: $P_1+P_2$.

Once these steps are completed a step 84 is performed of setting the variable m to the new maximum of the propagation delay entries in the array or matrix of storage cells. This value represents the overall propagation delay of the system as it is assembled so far, and it is determined by taking the larger of (a) the previous value of the variable m and (b) the newly calculated propagation delay for each identified and qualified ordered pair of components.

Figure 13:
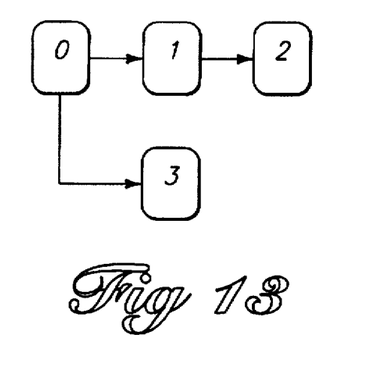
FIG. 13 is yet another example of an interconnected system of components.
Figure 14:
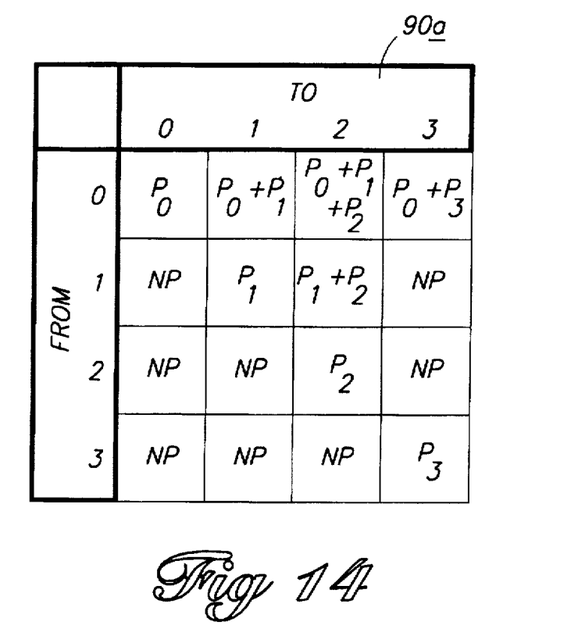
FIG. 14 illustrates a memory array that has already been updated with propagation delays to reflect the components and connections of FIG. 13.

FIGS. 13–16 illustrate a further, somewhat more complicated example of adding a new connection in a system. FIG. 13 shows a system similar to the one already discussed, except that a component 3 has been added along with a connection from component 0 to component 3. FIG. 14 shows a matrix that has already been filled in using the steps of FIGS. 10 and 12.

Figure 15:
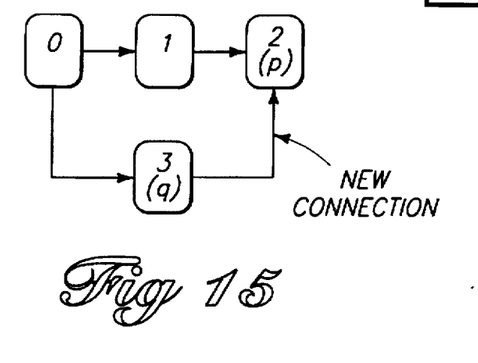
FIG. 15 shows the addition of a new connection to the system of FIG. 13.
Figure 16:
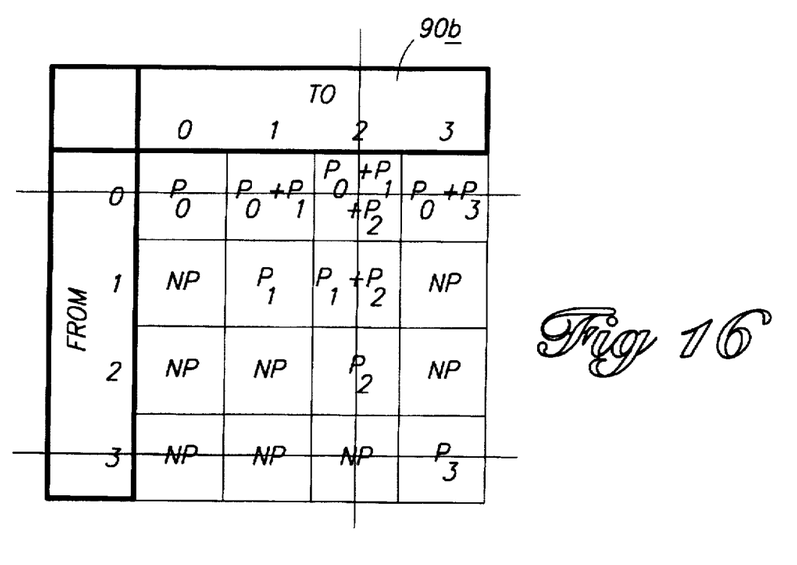
FIG. 16 illustrates the identification of cells within a memory array that are to be potentially updated in response to the new connection of FIG. 15.

In FIG. 15, a new connection has been specified from component 3 to component 2. FIG. 16 illustrates the identification of components that potentially need to be updated. All rows are identified that have existing entries in column q, in this case column 3. This step identifies rows 0 and 3. All columns are identified that have existing entries in row p, in this case row 2. This step identifies only column 2. Lines are drawn through the identified rows and columns in FIG. 16. The only cells that fall within both an identified row and an identified column are cells $C_{0,2}$ and $C_{3,2}$. A value is calculated for each of these cells in accordance with step 81 of FIG. 12: $P_{0,2}=P_{0,3}+P_{2,2}=(P_0+P_3)+P_2$. $P_{3,2}=P_{3,3}+P_{2,2}=P_2+P_3$. At this point, these are tentative values. However, cell $C_{3,2}$ has no previous entry, so it can be updated with the calculated value without further qualifications. Cell $C_{0,2}$ already contains an entry, so its value is only updated if the value for the newly completed path is greater than the prior value and if a loop is not being formed by the specification of the new connection. The latter determination is made by examining cell $C_{2,3}$. Since the value in this cell is NP, indicating the absence of a path from component 2 to component 3, it is not the case that a loop is being formed. Accordingly, cell $C_{0,2}$ is updated with the newly calculated value if and only if the new value is greater than the value of the existing entry in cell $C_{0,2}$.

The steps of FIG. 12 are conveniently implemented in a two-stage nested loop as indicated in the pseudo code of Table 1 below:

TABLE 1

```
void connect_components (Component q, Component p)
{
    for (int x = 0; x < n; x++)      //for all cells where the upstream
    {                                 //component has a connection to
        if (matrix[x,q] != NP)        //component q
        {
            for (int y = 0; y < n; y++)   //for all cells where the downstream
            {                              //component has a connection from
                if (matrix[p,y] != NP)    //component p
                {
                    int d = matrix[x,q] + matrix[p,y];   //calculate path delay
                    if (matrix[x,y] == NP)   //if there is no pre-existing path
                    {                         //from component x to component y
                        matrix[x,y] = d      //update matrix with path delay
                        m = max(m, d);       //update m with new maximum
                    }
                    else                     //or if new value is greater than old
                        if (matrix[x,y] < matrix[x,q] + matrix[p,y]
                        && matrix[p,q] == NP)   //and this is not a loop
                        {
                            matrix[x,y] = d      //update matrix with path delay
                            m = max(m, d);       //update m with new maximum
                        }
                }
            }
        }
    }
}
```

The invention provides a surprisingly efficient way to determine propagation delays in a system of interconnected components. In addition, individual and overall propagation delays can be calculated as new components and connections are specified—rather than only after all such components and connections have been specified. This is a significant improvement over prior art methods.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A computer-implemented method of dynamically maintaining propagation delays in an array of computer storage cells, wherein each storage cell corresponds to a potential directed path network from an upstream component to a downstream component in a system containing a plurality of directedly interconnected components with associated individual propagation delays; the method comprising the following steps:

initializing the storage cells to values indicating an absence of the corresponding directed path networks;

upon specifying a new component in the system, writing the individual propagation delay of the new component to a storage cell corresponding to a directed path network from the new component to itself;

upon specifying a new connection from a first component to a second component, identifying any storage cell corresponding to a directed path network that includes a non-looping directed path completed by the new connection;

for each identified storage cell, calculating the propagation delay from the upstream component to the downstream component of the corresponding directed path network;

writing the calculated propagation delays to the storage cells corresponding to the directed path networks.

2. A method as recited in claim 1, wherein the identifying step comprises identifying any particular storage cell corresponding to a directed path network from an upstream component to a downstream component, wherein said particular storage cell satisfies both of the following two conditions:

a first storage cell corresponding to the directed path network from said upstream component to the first component contains a value indicating the presence of a directed path network; and a second storage cell corresponding to the directed path network from the second component to said downstream component contains a value indicating the presence of a directed path network.

3. A method as recited in claim 1, wherein the calculating step comprises:

calculating the propagation delay between the upstream component and the downstream component through the non-looping directed path completed by the new connection;

taking the maximum of (a) the calculated propagation delay between the upstream component and the downstream component through the non-looping directed path completed by the new connection and (b) any previous calculated propagation delay written to the storage cell corresponding to the directed path network between the upstream component and the downstream component.

4. A method as recited in claim 3, wherein the step of calculating the propagation delay between the upstream component and the downstream component through the non-looping directed path completed by the new connection comprises:

summing (a) the propagation delay from the upstream component to the first component and (b) the propagation delay from the second component to the downstream component.

5. A method as recited in claim 3, wherein the step of calculating the propagation delay between the upstream component and the downstream component through the non-looping directed path completed by the new connection comprises:

reading a first propagation delay from the storage cell corresponding to the potential directed path network from the upstream component to the first component;

reading a second propagation delay from the storage cell corresponding to the potential directed path network from the second component to the downstream component;

summing the first and second propagation delays.

6. A method as recited in claim 1, further comprising a step of detecting a loop in the directed path completed by the new connection, said detecting step comprising determining whether the storage cell corresponding to the directed path network from the second component to the first component contains a value indicating the presence of a directed path network.

7. A method as recited in claim 1, further comprising a step of detecting a loop in the directed path completed by the new connection, said detecting step comprising:

reading the storage cell corresponding to the directed path network from the second component to the first component;

concluding that the directed path completed by the new connection is a loop if the storage cell corresponding to the potential directed path network from the second component to the first component contains a value indicating the presence of a directed path network.

8. A method as recited in claim 1 and further comprising a step of finding the maximum propagation delay contained in the array of storage cells.

9. A method as recited in claim 8, wherein the step of finding the maximum propagation delay comprises a step of taking the maximum of (a) a previous value of the maximum propagation delay and (b) the calculated propagation delay from the upstream component to the downstream component.

10. A computer-implemented method of dynamically maintaining propagation delays through a system of directedly interconnected components, each such component having a respective individual propagation delay, the method comprising the following steps:

enumerating a component number for each component added to the system;

maintaining an array of storage cells in computer memory for containing propagation delay entries, the storage cells being logically referenced by row and column numbers;

upon specifying a new component in the system, writing the individual propagation delay of the new component to the storage cell having row and column numbers equal to the component number of the new component;

upon specifying a new connection from a component q to a component p, identifying any storage cell with row number x and column number y such that both (a) the storage cell having row number x and column number q contains a propagation delay entry, and (b) the storage cell having row number p and column number y contains a propagation delay entry;

for each identified storage cell having row number x and column number y, calculating the propagation delay from component x to component y and writing the calculated propagation delay to the identified storage cell.

11. A method as recited in claim 10, wherein the calculating step comprises:

calculating the propagation delay between component x and component y through a non-looping directed path completed by the new connection;

taking the maximum of (a) the calculated propagation between component x and component y through the non-looping directed path completed by the new connection and (b) any previous propagation delay entry in the storage cell having row number x and column numbers.

12. A method as recited in claim 11, the step of calculating the propagation delay between component x and component y through the non-looping directed path completed by the new connection comprising:

summing the propagation delay entries of (a) the storage cell having row number x and column number q, and (b) the storage cell having row number p and column number y.

13. A method as recited in claim 11, further comprising:

for each identified storage cell with row number x and column number y, reading a first value from the storage cell with row number x and column number q, and reading a second value from the storage cell with row number p and column number y;

the step of calculating the propagation delay between component x and component y through the non-looping directed path completed by the new connection comprising a step of summing the first and second values.

14. A method as recited in claim 11, further comprising a step of detecting a looping directed path completed by the new connection, said detecting step comprising determining whether the storage cell having row number p and column number q contains a propagation delay entry.

15. A method as recited in claim 10 and further comprising a step of finding the maximum propagation delay entry contained in the array of storage cells.

16. A method as recited in claim 15, wherein the step of finding the maximum propagation delay entry comprises taking the maximum of (a) any previous propagation delay entry and (b) the propagation delay contained in the storage cell having row number x and column numbers.

17. A system for maintaining propagation delays through directedly interconnected components, each such component having a respective individual propagation delay, comprising:

a data processor;

read/write memory associated with the data processor;

an array of storage cells in computer memory for containing propagation delay entries, the storage cells being logically referenced by row and column numbers;

the data processor being programmed to perform the following steps:

enumerating a component number for each component specified in the system; when a new component is specified in the system, writing the individual propagation delay of the new component to the storage cell having row and column numbers equal to the component number of the new component;

when a direct connection is specified from a component q to a component p, identifying any storage cell with row number x and column number y such that both (a) the storage cell having row number x and column number q contains a propagation delay entry, and (b) the storage cell having row number p and column number y contains a propagation delay entry;

for each identified storage cell having row number x and column number y, calculating the propagation delay from component x to component y and writing the calculated propagation delay to the identified storage cell.

18. A system as recited in claim 17, the programmed calculating step comprising further steps as follows:

calculating the propagation delay between component x and component y through a non-looping directed path completed by the new connection;

taking the maximum of (a) the calculated propagation between component x and component y through the non-looping directed path completed by the new connection and (b) any previous propagation delay entry in the storage cell having row number x and column number y.

19. A system as recited in claim 18, the step of calculating the propagation delay between component x and component y through the non-looping directed path completed by the new connection comprising:

summing the propagation delay entries of (a) the storage cell having row number x and column number q, and (b) the storage cell having row number p and column number y.

20. A system as recited in claim 18, the data processor being further programmed to perform the following step:

for each identified storage cell with row number x and column number y, reading a first value from the storage cell with row number x and column number q, and reading a second value from the storage cell with row number p and column number y;

the step of calculating the propagation delay between component x and component y through the non-looping directed path completed by the new connection comprising a step of summing the first and second values.

21. A system as recited in claim 18, the data processor being further programmed to perform a step of detecting a looping directed path completed by the new connection, said detecting step comprising determining whether the storage cell having row number p and column number q contains a propagation delay entry.

22. A system as recited in claim 17, the data processor being further programmed to perform a step of finding the maximum propagation delay entry contained in the array of storage cells.

23. A system as recited in claim 22, wherein the programmed step of finding the maximum propagation delay entry comprises taking the maximum of (a) any previous propagation delay entry and (b) the propagation delay contained in the storage cell having row number x and column number y.

24. A system as recited in claim 17, the data processor being further programmed to perform the following step:

for each identified storage cell with row number x and column number y, reading a first value from the storage cell with row number x and column number q, and reading a second value from the storage cell with row number p and column is number y;

the step of calculating the propagation delay between component x and component y through the non-looping directed path completed by the new connection comprising:

summing the first and second values;

taking the maximum of (a) the summed first and second values and (b) any previous propagation delay entry in the storage cell having row number x and column number y.

25. A system as recited in claim 24, the data processor being further programmed to perform a step of detecting a looping directed path completed by the new connection, said detecting step comprising determining whether the storage cell having row number p and column number q contains a propagation delay entry.

* * * * *